US009671485B2

(12) United States Patent
Vennelakanti et al.

(10) Patent No.: US 9,671,485 B2
(45) Date of Patent: Jun. 6, 2017

(54) SYSTEM AND METHOD FOR CALIBRATING A HIGH RESOLUTION DATA ACQUISITION SYSTEM WITH A LOW RESOLUTION DIGITAL TO ANALOG CONVERTER

(75) Inventors: V. s. s Kumar Vennelakanti, Prakasam (IN); Ramesh Babu Srinivasa, Mysore (IN)

(73) Assignee: Fluke Corporation, Everett, WA (US)

( * ) Notice: Subject to any disclaimer, the term of this patent is extended or adjusted under 35 U.S.C. 154(b) by 1919 days.

(21) Appl. No.: 12/911,475

(22) Filed: Oct. 25, 2010

(65) Prior Publication Data

US 2011/0098956 A1    Apr. 28, 2011

(30) Foreign Application Priority Data

Oct. 26, 2009    (IN) ........................... 2592/CHE/2009

(51) Int. Cl.
| | |
|---|---|
| G01D 21/00 | (2006.01) |
| G01R 35/00 | (2006.01) |
| G01D 18/00 | (2006.01) |
| G01R 15/12 | (2006.01) |
| G01R 15/00 | (2006.01) |

(52) U.S. Cl.
CPC ........... G01R 35/005 (2013.01); G01D 18/00 (2013.01); G01D 18/008 (2013.01); G01R 15/00 (2013.01); G01R 15/12 (2013.01)

(58) Field of Classification Search
CPC ... G01D 18/00; G01R 35/005; H03M 1/1009; H03M 1/1047
See application file for complete search history.

(56) References Cited

U.S. PATENT DOCUMENTS

| | | | |
|---|---|---|---|
| 4,612,533 A | 9/1986 | Evans | |
| 5,488,368 A * | 1/1996 | Brown et al. ................. | 341/119 |

(Continued)

FOREIGN PATENT DOCUMENTS

| | | |
|---|---|---|
| JP | 61-58323 A | 3/1986 |
| JP | 3-216022 A | 9/1991 |

(Continued)

OTHER PUBLICATIONS

JPH08-023275 Machine Translation.*

(Continued)

*Primary Examiner* — Sujoy Kundu
*Assistant Examiner* — L. Anderson
(74) *Attorney, Agent, or Firm* — Seed IP Law Group LLP

(57) ABSTRACT

A high resolution data acquisition (DAQ) system is initially calibrated with a reference source having a resolution higher than the DAQ system. Measurements over the operating range of the DAQ system are taken, and characteristic calibration coefficients are determined from the measurements. Software corrections based upon the calibration coefficients are made to DAQ system measurements. A digital to analog converter (DAC) on-board the DAQ system having a lower resolution than the DAQ system is calibrated by generating a look-up table of input digital codewords and output electrical signals measured by the calibrated DAQ system. This look-up table is used to field calibrate the DAQ system using only the DAC, rather than the high resolution reference source.

20 Claims, 3 Drawing Sheets

(56) References Cited

U.S. PATENT DOCUMENTS 7,064,547 B1    6/2006  King et al.
2008/0116880 A1*  5/2008  McEachern ........ G01R 19/2513
                                                              324/130

FOREIGN PATENT DOCUMENTS

| JP | 7-93178 A | 4/1995 |
| JP | 8-23275 A | 1/1996 |
| JP | 10-145231 A | 5/1998 |
| JP | 10300826 A | 11/1998 |
| JP | 2001-77691 A | 3/2001 |
| JP | 2002-111494 A | 4/2002 |
| JP | 2002-368615 A | 12/2002 |

OTHER PUBLICATIONS

Wolfram Mathworld, Least Squares Fitting, 2000, Wolfram Research, Inc, pp. 1-3.*
European Patent Application No. 10188959.0, Extended European Search Report, 5 pages, Apr. 1, 2011.
Japanese Office Action mailed Jun. 10, 2014, in Japanese Application No. 2010-240108, filed Oct. 26, 2014, 6 pages.
Japanese Office Action mailed Dec. 3, 2013, in Japanese Application No. 2010-240108, filed Oct. 26, 2014, 3 pages.

* cited by examiner

SYSTEM AND METHOD FOR CALIBRATING A HIGH RESOLUTION DATA ACQUISITION SYSTEM WITH A LOW RESOLUTION DIGITAL TO ANALOG CONVERTER

CROSS-REFERENCE TO RELATED APPLICATIONS

This application claims the benefit of the following application which is incorporated by reference in its entirety, Indian Provisional Application No. 2592/CHE/2009, entitled "SYSTEM AND METHOD FOR CALIBRATING A HIGH RESOLUTION DATA ACQUISITION SYSTEM WITH A LOW RESOLUTION DIGITAL TO ANALOG CONVERTER", filed Oct. 26, 2009.

TECHNICAL FIELD

The present disclosure relates to calibration of a high resolution data acquisition system.

BACKGROUND

The accuracy of measurement equipment may drift gradually over time due to, for example, aging of components, temperature, humidity, environmental exposure, and abuse. To ensure measurement accuracy, periodic calibration of the equipment can be performed. By comparing measurements performed with the equipment to a known reference, correction factors can be determined and stored for use in conjunction with future measurements with the equipment. A reference source may be, for example, additional equipment configured to output a certain condition, (e.g., voltage, current, resistance, etc.) and provide the parameters associated with that condition at a certain resolution (e.g., milliamps, microamps, etc.) that can be used for performing calibration of the measurement instrument.

Typically, if a measurement instrument can perform measurements of a given resolution, the measurement parameters of a reference source that is used for calibration should be known at a higher resolution than that of the measurement instrument, usually at least an order or two higher to account for noise in the measurement process. If, however, the measurement instrument has a high resolution, the process for devising the measurement parameters of a reference source having an even higher resolution can be quite expensive.

SUMMARY

A high resolution data acquisition (DAQ) system is initially calibrated with a reference source having a resolution higher than the DAQ system. Measurements over the operating range of the DAQ system are taken, and characteristic calibration coefficients are determined from the measurements. Software corrections based upon the calibration coefficients are made to the DAQ system measurements. Subsequently, a digital to analog converter (DAC) on-board the DAQ system having a lower resolution than the DAQ system may be calibrated by referencing signals generated by the DAC to signals generated by generating a look-up table of input digital codewords and output electrical signals measured by the calibrated DAQ system. Then, in field calibrations where the high resolution reference is not available, the lower resolution DAC can be used to calibrate the DAQ system using the look-up table.

BRIEF DESCRIPTION OF THE DRAWINGS

Examples of calibration of a high resolution data acquisition system are illustrated in the figures. The examples and figures are illustrative rather than limiting.

DETAILED DESCRIPTION

Figure 1:
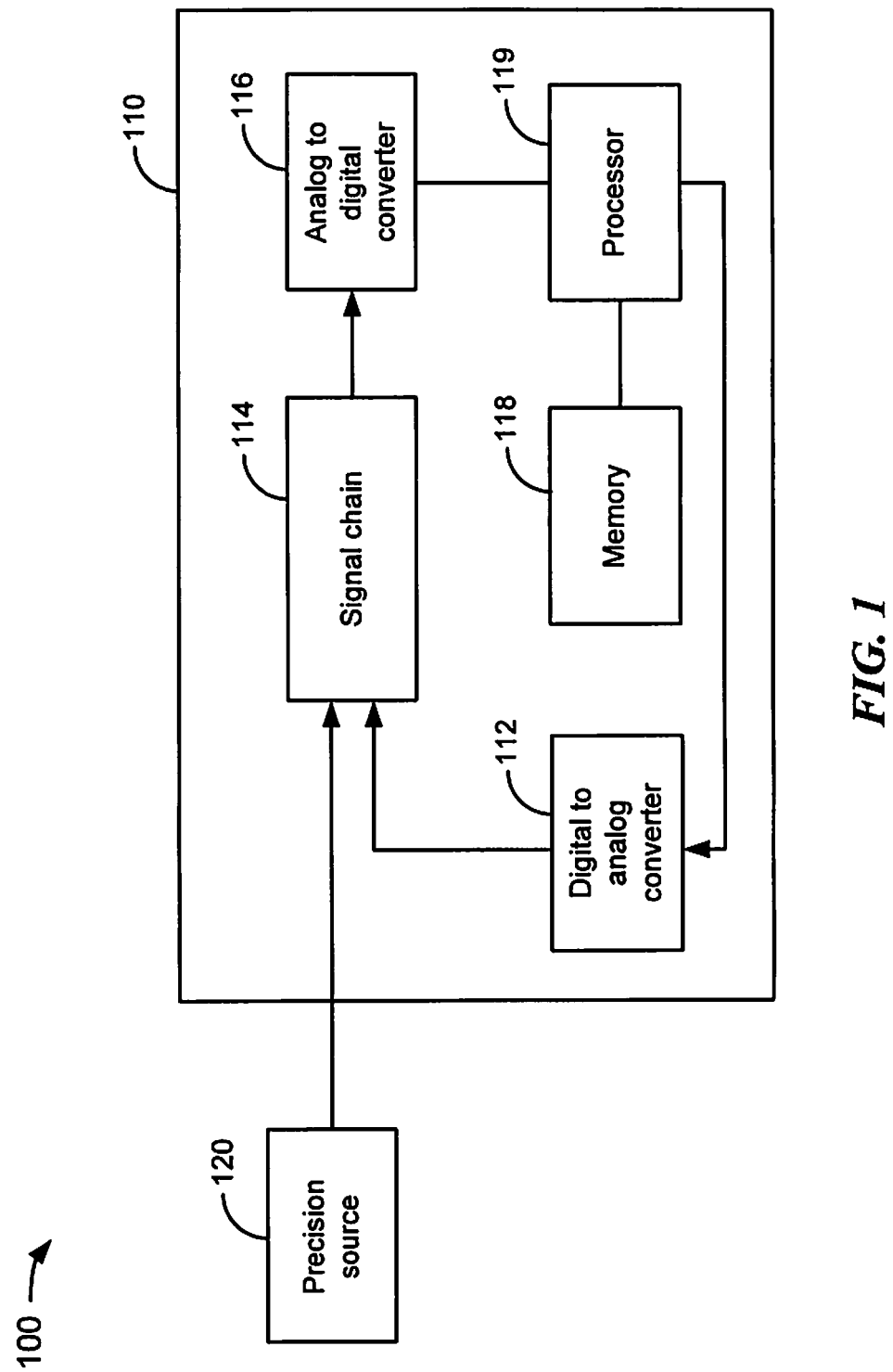
FIG. 1 depicts a block diagram illustrating an example of a high resolution data acquisition system, according to an embodiment of the disclosure.

The following description and drawings are illustrative and are not to be construed as limiting. Numerous specific details are described to provide a thorough understanding of the disclosure. However, in certain instances, well-known or conventional details are not described in order to avoid obscuring the description.

Without intent to further limit the scope of the disclosure, examples of instruments, apparatus, methods and their related results according to the embodiments of the present disclosure are given below. Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

Precision measurement instruments should be periodically calibrated in order to minimize measurement uncertainty due to aging components or drifting component performance. Traditionally, measurement instruments have required a reference source that has a higher resolution than the resolution capability of the measurement instrument to be calibrated. However, if the measurement instrument has a high resolution capability, for example a data acquisition (DAQ) system that uses a 24-bit analog to digital converter, it may be possible that a precision source that has at least 28-bit resolution may be needed for calibrating the high resolution DAQ system. However, 28-bit precision sources can be expensive. Furthermore, high precision reference sources can be sensitive pieces of equipment that are not suitable for use in the field on an ongoing basis, thus necessitating that the DAQ system be shipped back to the factory or a service center for calibration. It would be preferable to find a way to perform a calibration of the DAQ system using a less expensive, lower resolution calibration source that can be placed on board each DAQ system so that each system can be conveniently calibrated in the field.

FIG. 1 depicts a block diagram 100 illustrating an example of a high resolution data acquisition system, according to an embodiment of the disclosure. A high precision reference source 120 is shown external to the analog front end 110 of the DAQ system that is used to perform an initial calibration of the DAQ system. The high precision reference source 120 has a higher resolution than the analog front end 110. For example, if the analog front end 110 of the DAQ system has a 24-bit resolution, the resolution of the high precision reference source 120 should be at least 24 bits or higher, for example 28 bits, to account for the presence of noise. The analog front end 110 of the DAQ system can be initially calibrated at the factory using the high precision reference source 120, although the initial calibration can take place at any location at any point in time during the life of the DAQ system.

The analog front end 110 of the DAQ system comprises a digital to analog converter (DAC) 112, a signal chain 114, and an analog to digital converter (ADC) 116. The signal chain 114 is the series of electrical components that carry the signal through the DAQ system to the ADC 116 and includes signal conditioning elements that, for clarity, are not shown; the signal chain can have one or more different channels. Each channel in the signal chain 114 can have a different gain, and each channel should be calibrated individually because the gain error, offset, and non-linearities can vary from channel to channel. The ADC 116 is an electronic circuit that converts continuous analog signals to discrete digital values. The ADC 116 is coupled to the output of the signal chain 114 and outputs measurements of the DAQ system to a processor 119.

The DAQ also includes one or more memory units 118 and one or more processors 119. Memory units 118 can include, but are not limited to, RAM, ROM, and any combination of volatile and non-volatile memory. The memory units 118 of the DAQ system are used to store calibration constants, look-up tables, and software calibration corrections. Further, characteristic slope and offset coefficients for each channel can also be stored in the memory, as described below.

In operation, the input to the signal chain 114 is the data that is to be acquired, for example voltage measurements or other electrical signals. However, in the calibration setup of the DAQ system, one input is provided during an initial calibration by the high precision reference source 120, and another input is provided by the calibrated DAC 112 during subsequent calibrations of the DAQ system. The DAC 112 is an electronic circuit that accepts a digital codeword as an input and outputs an analog electrical signal, where the analog electrical signal output has a lower resolution than that of the DAQ system. For example, the digital codeword can be an n-bit digital codeword (e.g., 1100, where n equals 4) that corresponds to a particular electrical signal to be generated. The resolution of the DAC can be quantified in terms of the number of bits used by the DAC. Further, the DAC 112 should have a low temperature coefficient or a temperature coefficient that stays relatively constant over a temperature range at which the DAQ system can be expected to be calibrated in the field.

The processor 119 can access the memory 118 to calibrate the analog front end 110 of the DAQ system using the DAC 112 as a calibration source in the field or anywhere a high precision reference source 120 is not available. Further, the processor 119 also applies any software calibration corrections stored in memory 118 to measurements made by the DC 116 prior to display to the user.

Figure 2:
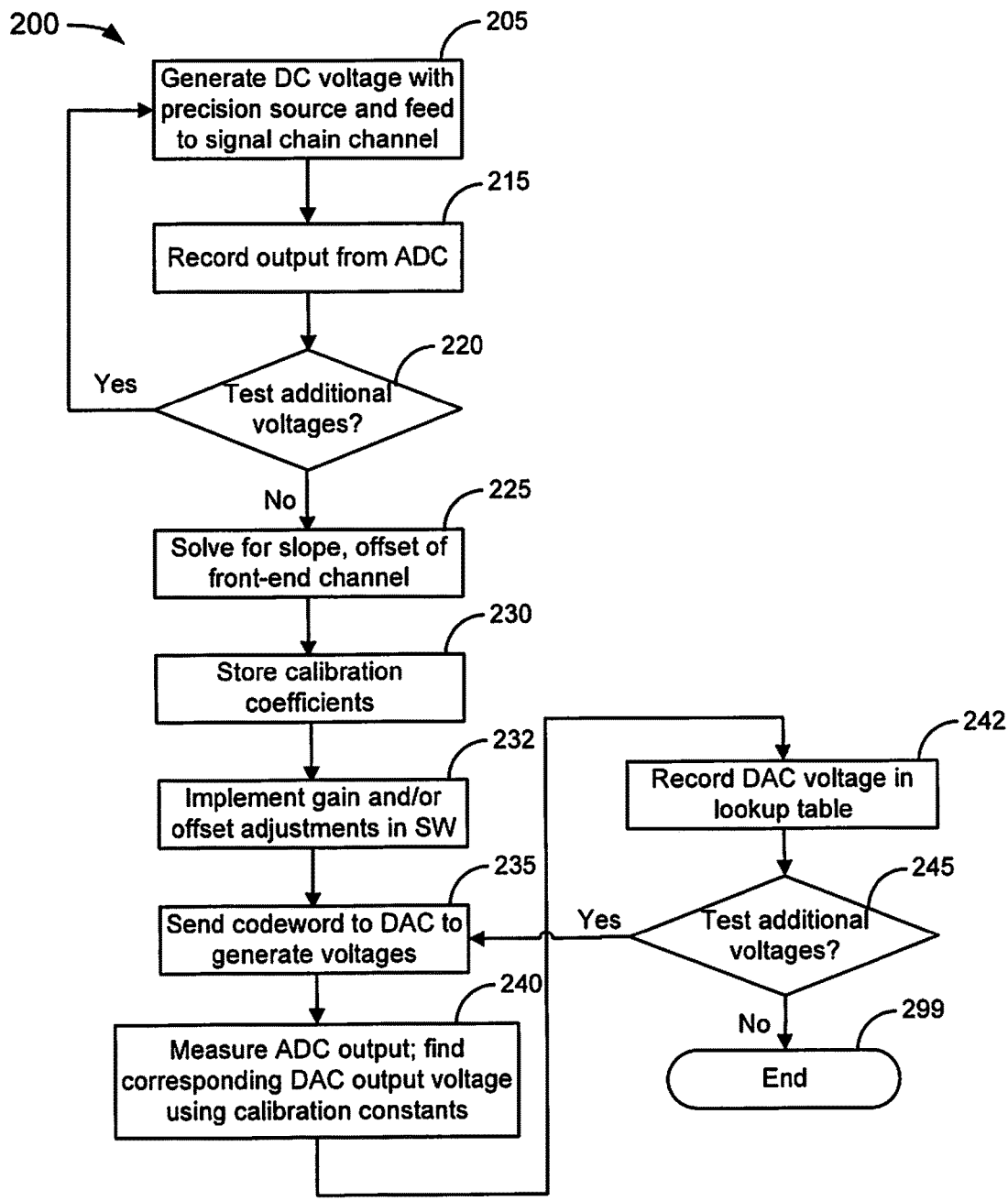
FIG. 2 depicts a flow diagram illustrating an exemplary process of an initial calibration of one channel of the signal chain of a high resolution data acquisition system, according to an embodiment of the disclosure.

FIG. 2 depicts a flow diagram 200 illustrating an exemplary process of an initial calibration of one channel of the signal chain of a high resolution data acquisition system, according to an embodiment of the disclosure.

At block 205, the high precision reference source 120 is used to generate a direct current (DC) voltage that is fed into one of the channels of the signal chain 114. Alternatively, the high precision reference source 120 can generate any other kind of electrical signal that can be accepted and measured by the data acquisition system. The generated DC voltage should be within the operating range of the ADC 116. The high precision reference source 120 can be controlled by the processor 119 or an external computer running, for example, a LabVIEW™ controller.

After the DC voltage is fed into the signal chain channel, the ADC measurement of the output of the signal chain 114 is read and recorded in memory 118 at block 215 along with the generated DC voltage.

At decision block 220, the system determines if testing of additional voltages within the measuring range of the ADC still needs to be performed. In one embodiment, a set of testing inputs are predefined for each channel of the DAQ system such that the entire measuring range of the DAQ system is tested. By testing the entire measuring range of the system, the errors and non-linearities present at different amplitude levels can be determined. If further voltages need to be tested (block 220—Yes), the process returns to block 205 to generate a different DC voltage with the high precision reference source 120 to feed into the signal chain channel. If the previously tested voltages sufficiently span the measurement range of the ADC 116 and no further voltages need to be tested (block 220—No), the process continues to block 225.

The input voltages generated by the precision source 120 at block 205 and the corresponding output voltages read from the ADC 116 and recorded at block 215 are measured data points of the DAQ system. A curve can be fitted to these data points, and the resulting curve can be used as a characteristic curve for the front-end channel of the DAQ system. The slope and offset of the curve for the front-end channel is determined at block 225. A least squares fitting algorithm can be used to find the best-fitting curve to the data by minimizing the sum of the squares of the offsets of the data points from the curve. A description of how to apply this algorithm is provided below.

Let AX=B, where the matrices A, X, and B are given by:

$$A = \begin{bmatrix} n & \sum x_i \\ \sum x_i & \sum x_i^2 \end{bmatrix}, \quad X = \begin{bmatrix} b \\ a \end{bmatrix}, \quad B = \begin{bmatrix} \sum y_i \\ \sum (x_i y_i) \end{bmatrix},$$

where n is the number of data point measurements taken for each channel, $x_i$ is the input value fed to the signal chain channel 114, $y_i$ is the output from the signal chain channel measured by the ADC 116, and i is an index value that runs from 1 to n. By solving for the equation for the matrix X, the coefficients "a" and "b" can be determined. The coefficient "a" is the slope of the curve fitted to the data points obtained from the front-end channel, and the coefficient "b" is the offset of the same curve. These calibration coefficients, as determined using the high precision reference source 120, are stored in memory 118 at block 230. In one embodiment, adjustments to the gain and/or the offset of the signal channel can be made. For example, the offset can be zeroed out or the gain can be set to a desired value. At block 232, the corrections to the gain and/or offset can be implemented in software stored in memory 118 and run by the processor 119 when actual measurements are made by the ADC 116.

A person of skill in the art will recognize that other methods can also be used for curve fitting the data points, and a different curve may be obtained. The resulting calibration curve is used to determine the calibration coefficients for the front-end channel.

The DAC 112 should also be calibrated because it can have its own gain and offset errors. At block 235, a digital codeword corresponding to a particular DC voltage is fed to the input of the DAC 112. Alternatively, the DAC 112 can be used to generate any other type of electrical signal that can be accepted by the data acquisition system. The corresponding analog voltage is generated by the DAC 112 and sent to the input of the channel of the signal chain 114. At block 240, a measurement of the output of ADC 116 is taken, where the measurement is corrected for gain and/or offset adjustments with software as described above, and the corresponding DAC output voltage is determined. At block 242, the corresponding DAC output voltage is recorded in a look-up table in memory 118. Because the analog front end 110 of the DAQ system has already been calibrated using the high precision reference source 120 (block 205 through block 232), the voltages generated by the DAC 112 are able to be determined accurately. Thus, although the DAC 112 may not generate voltages as precisely as the high precision reference source 120, the corresponding analog voltage as measured by the calibrated high resolution ADC 116 is recorded along with the corresponding digital codeword input to the DAC 112, and the generated DAC 112 voltages are referenced to those of the reference source 120. Consequently, the DAC 112 is not required to have as high precision as the reference source 120. Further, the DAC output voltage is repeatable with the same precision to which it generates output voltage, At decision block 245 the system determines if testing of additional voltages within the measuring range of the ADC still needs to be performed. If further voltages need to be tested (block 245—Yes), the process returns to block 235 to generate a different DC voltage with the DAC 112 to feed into the signal chain channel.

If the previously tested voltages sufficiently span the measurement range of the ADC 116 and no further voltages need to be tested (block 245—No), the process ends at block 299. The process of calibrating one of the channels of the signal chain of the DAQ system ends at block 299. The process 200 should be repeated for each of the other channels of the DAQ system signal chain.

The DAC performance can degrade over time due to factors including, but not limited to, aging and environmental conditions. Consequently, the unit should be calibrated with an external precision source on a regular basis, for example once or twice a year, depending upon the characteristics and operating conditions of the DAC.

Figure 3:
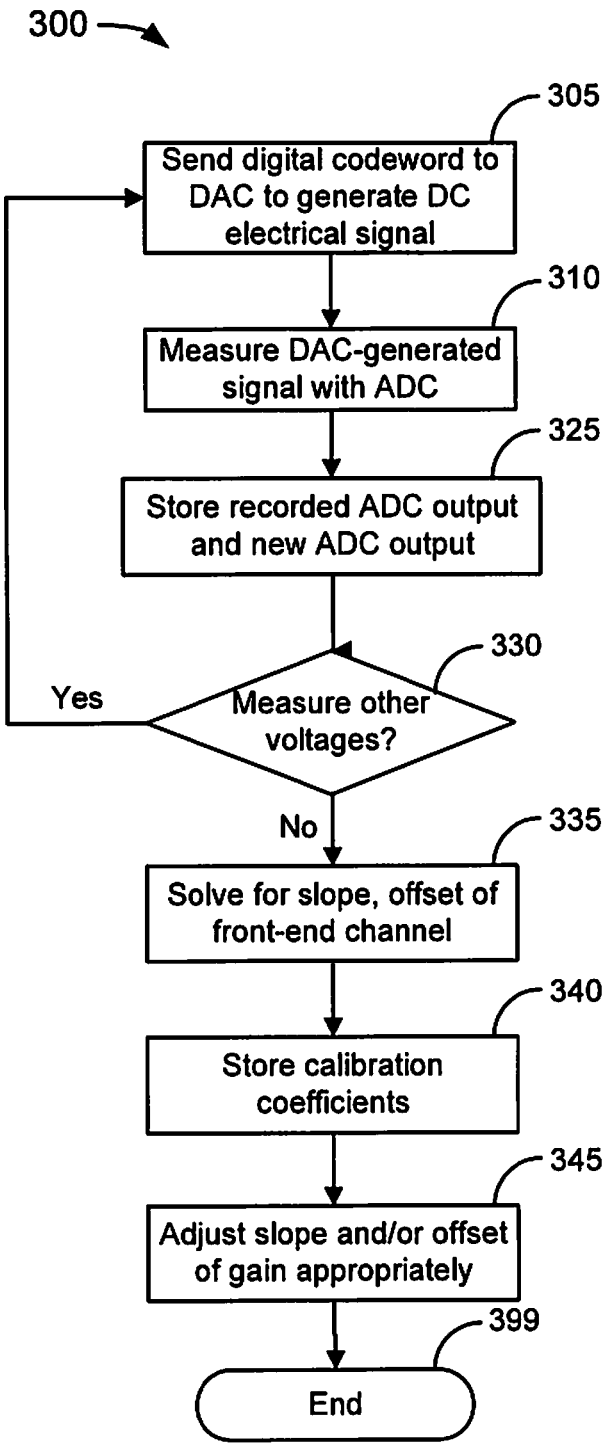
FIG. 3 depicts a flow diagram illustrating an exemplary process of a subsequent calibration of a data acquisition system using a digital to analog converter source that has a lower resolution than the data acquisition system, according to an embodiment of the disclosure.

FIG. 3 depicts a flow diagram 300 illustrating an exemplary process of a subsequent calibration of a DAQ system using a DAC source that has a lower resolution than the DAQ system, according to an embodiment of the disclosure. In one embodiment, calibration process 300 should be performed under similar temperature conditions as calibration process 200 to ensure that variations due to temperature changes do not effect the measurements. In one embodiment, the temperature coefficient of the DAC 112 can be selected to have a low temperature coefficient over the expected temperature range at which subsequent calibrations will be performed.

At block 305, one of the digital codewords stored in the look-up table at block 240 is generated by the processor 119 and fed to the DAC 112 to prompt the DAC to generate a corresponding analog voltage. Alternatively, the DAC 112 can be used to generate any other type of analog electrical signal that can be accepted by the data acquisition system. At block 310, the analog voltage produced by the DAC 112 is measured by the ADC 116 after it has propagated through the signal chain 114. Then at block 325, the voltage measured by the ADC 116 that was stored in the first look-up table that corresponds to the digital codeword fed to the DAC 112 and the voltage measured at block 310 by the ADC 116 are stored as an entry in a second look-up table in memory 118. It should be noted that the measurements made by the ADC 116 automatically includes the software corrections implemented by the processor 119 as described at block 232 above.

At decision block 330, the system determines if other look-up table entries still need to be measured. If more entries are needed in the second lookup table (block 330—Yes), the process returns to block 305. If no more entries are needed in the second look-up table (block 330—No), the process continues to block 335 where the slope and offset of the front end channel are determined, using a process similar to that described above for block 225. At block 340, the newly determined calibration coefficients are stored in memory 118.

At block 345, corrections to the gain and/or the offset for the signal chain channel are implemented in software to be run by the processor 119. The software corrections at block 345 are implemented in addition to the software corrections previously implemented at block 232. Thus, when real data acquisition measurements are made, the calibrated system will provide a correct reading from the ADC 116. The process ends at block 399. The process 300 should be repeated for each of the other channels of the DAQ system signal chain.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this patent application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

What is claimed is:

1. A data acquisition (DAQ) system having a first resolution and comprising a digital to analog converter (DAC), wherein the DAC has a lower resolution than the first resolution and is configured to be used as a source for calibrating the DAQ system after initially calibrating the DAQ system and the DAC with a reference source having a higher resolution than the first resolution.

2. The data acquisition system of claim 1 wherein initially calibrating the DAQ system comprises:
   generating a first set of data points obtained by sending a first set of electrical signals to the DAQ system from the reference source and measuring a first set of output electrical signals from the DAQ system;
   generating a first set of calibration coefficients for the DAQ system from the first set of data points;
   applying a first software correction to measurements of the DAQ system based upon the first set of calibration coefficients; and
   further wherein initially calibrating the DAC comprises:
   generating a second set of data points obtained by sending digital codewords to the DAC to generate a second set of electrical signals from the DAC to the DAQ system and measuring a second set of output electrical signals from the DAQ system, wherein the first software correction has been applied; and
   storing the second set of data points for using the DAC as the source for calibrating the DAQ system.

3. The data acquisition system of claim 2 wherein generating a first set of calibration coefficients comprises fitting a curve to the first set of data points and determining a slope and an offset of the curve.

4. The data acquisition system of claim 3 wherein fitting a curve to the first set of data points comprises using a least squares fitting algorithm.

5. The data acquisition system of claim 2 wherein using the DAC as the source for calibrating the DAQ system comprises:
   generating each digital codeword in the second set of data points and feeding it to the DAC, wherein an output of the DAC couples to an input of the DAQ system;
   recording each corresponding measured output from the DAQ system;
   determining a second set of calibration coefficients from the digital codewords and corresponding measured outputs; and
   applying a second software correction to the first software correction to measurements of the DAQ system based upon the second set of calibration coefficients.

6. The data acquisition system of claim 2 wherein the DAQ system has multiple channels, and further wherein each channel has a first set of data points, a first software correction, a first set of calibration coefficients, and a second set of data points.

7. The data acquisition system of claim 6 wherein one or more of the multiple channels provide a gain.

8. The data acquisition system of claim 1 wherein the DAC has a low temperature coefficient.

9. A data acquisition (DAQ) system having a first resolution that is calibrated by a digital to analog converter having a lower resolution than the first resolution, comprising:
   a signal chain configured to accept an input electrical signal and provide signal conditioning;
   a digital to analog converter (DAC) coupled to an input of the signal chain, wherein the DAC is configured to accept a digital codeword input and output a corresponding analog electrical signal to the input of the signal chain, and further wherein the DAC has a second resolution that is lower than the first resolution;
   an analog to digital converter (ADC) coupled to an output of the signal chain;
   a memory configured to store a first software correction to measurements of the DAQ system based upon calibration of the DAQ system by a reference source having a resolution higher than the first resolution and a set of data obtained by sending a set of digital codewords to the DAC to generate a set of electrical signals from the DAC to the signal chain and measuring a set of output electrical signals from the ADC; and
   a processor configured to control the DAC based at least upon the set of data to calibrate the DAQ system, wherein calibrating the system comprises:
   generating each digital codeword in the set of data and feeding it to the DAC, recording each corresponding measured output from the DAQ system, determining calibration coefficients from the digital codewords and measured outputs, and applying a second software correction based upon the set of calibration coefficients to calibrate the DAQ system, wherein the DAQ system is initially calibrated with a reference source having a third resolution that is higher than the first resolution to generate the first software correction.

10. The system of claim 9 wherein a least squares fitting algorithm is used to determine the calibration coefficients from the digital codewords and measured outputs.

11. The system of claim 9 wherein the DAC has a low temperature coefficient.

12. The system of claim 11 wherein the signal chain comprises multiple channels, and a set of calibration coefficients is stored in memory for each channel.

13. The system of claim 12 wherein one or more channels in the signal chain has a gain.

14. The system of claim 9 wherein calibration with the reference source having a third resolution higher than the first resolution comprises:

generating a first set of data points obtained by sending a first set of electrical signals to the signal chain from the reference source and measuring a first set of output electrical signals from the ADC;

generating a first set of calibration coefficients for the DAQ system from the first set of data points; and applying the first software correction to measurements of the DAQ system based upon the first set of calibration coefficients.

15. A method of calibrating a data acquisition (DAQ) system using a reference source having a lower resolution than the DAQ system, comprising:

accessing a first set of data comprising digital codewords and corresponding measured DAQ system outputs, wherein the first set of data was obtained by:

pre-calibrating the DAQ system with a precision reference source having a higher resolution than the DAQ system, sending each digital codeword to a digital to analog converter (DAC) to generate a first set of electrical signals from the DAC to an input of the DAQ system, wherein the DAC has a lower resolution than the DAQ system, and measuring a first set of output electrical signals from the DAQ system;

sending each digital codeword to the DAC to generate a second set of electrical signals from the DAC to the input of the DAQ system;

measuring each second output electrical signal from the DAQ system;

recording as a second set of data each measured output electrical signal from the first set of data and each measured second output electrical signal;

fitting the second set of data to a curve;

determining calibration coefficients from the curve; and applying software corrections to the DAQ system based at least upon the determined calibration coefficients.

16. The method of claim 15 wherein the DAQ system comprises multiple channels, and each channel is calibrated independently.

17. The method of claim 16 wherein one or more of the channels provide a gain.

18. The method of claim 15 wherein pre-calibrating the DAQ system comprises:

generating a reference set of data points obtained by sending a reference set of electrical signals to the DAQ system from the precision reference source and measuring a reference set of output electrical signals from the DAQ system;

generating a reference set of calibration coefficients for the DAQ system from the reference set of data points; and applying a reference software correction to measurements of the DAQ system based upon the reference set of calibration coefficients.

19. The method of claim 15 wherein the DAC has a low temperature coefficient.

20. The method of claim 15 wherein a least squares fitting algorithm is used for fitting the data to the curve.

* * * * *